United States Patent [19]

Kojima et al.

[11] Patent Number: 4,644,473

[45] Date of Patent: Feb. 17, 1987

[54] CORRECTION CIRCUIT FOR A STATIC MAGNETIC FIELD OF AN NMR APPARATUS AND NMR APPARATUS FOR UTILIZING THE SAME

[75] Inventors: Fumitoshi Kojima; Masahiko Hatanaka, both of Ootawara, Japan

[73] Assignee: Kabushiki Kaisha Toshiba, Kawasaki, Japan

[21] Appl. No.: 603,726

[22] Filed: Apr. 25, 1984

[30] Foreign Application Priority Data

Apr. 30, 1983 [JP] Japan .................................. 58-76424

[51] Int. Cl.[4] ...................... G01N 27/00; G01R 33/08
[52] U.S. Cl. .................................. 364/414; 324/309; 324/310
[58] Field of Search ............... 324/300, 307, 309, 310, 324/313, 314; 364/414

[56] References Cited

U.S. PATENT DOCUMENTS

| | | | |
|---|---|---|---|
| 4,093,910 | 6/1978 | Hill | 324/310 |
| 4,165,479 | 8/1979 | Mansfield | 324/313 |
| 4,193,024 | 3/1980 | Hoult et al. | 324/313 |
| 4,284,950 | 8/1981 | Burl et al. | 324/313 |
| 4,472,683 | 7/1984 | Sekihara et al. | 324/300 |

FOREIGN PATENT DOCUMENTS

| | | |
|---|---|---|
| 1241843 | 8/1971 | United Kingdom . |
| 2027208 | 2/1980 | United Kingdom . |
| 2053481 | 2/1981 | United Kingdom . |

OTHER PUBLICATIONS

Kumabe, A. Takiguchi et al.; "A Proton Resonance Magnetic Field Stabilizer Using a Frequency Stabilizer"; *Nuclear Instruments and Methods*, No. 3, Dec. 1973, pp. 387-393.

Ching Ming Lai et al.; "Automatic Correction of Nuclear Magnetic Resonance Zeugmatographic Projections"; *J. Phys. E: Sci. Instrum.*, vol. 14, 1981, pp. 874-878.

Hutchison et al., "A Whole-Body NMR Imaging Machine," J. Phys, E: Sci. Instrum., vol. 12, 1980, pp. 947-955.

Power System for Electromagnet in an NMR Spectrometer, Vetrov et al. 8164, Instruments and Experimental Techniques, vol. 23, No. 3, Part 2, May-Jun. 1980, New York, USA, pp. 715-717.

*Primary Examiner*—Jerry Smith
*Assistant Examiner*—Kim Thanh Bui
*Attorney, Agent, or Firm*—Finnegan, Henderson, Farabow, Garrett & Dunner

[57] ABSTRACT

In the NMR apparatus the resonant conditions may be kept constant by adjusting the strength of the static magnetic field. The echo signal that is induced under the specific conditions is processed so as to obtain the deviation of the resonant frequency in the correction circuit. The shift of the given static magnetic field is calculated based upon the deviation of the resonant frequency. The DC energizing current for the $H_O$ power supply is varied based upon the magnetic field shift so as to maintain the NMR phenomenon at the desirable resonant conditions.

13 Claims, 8 Drawing Figures

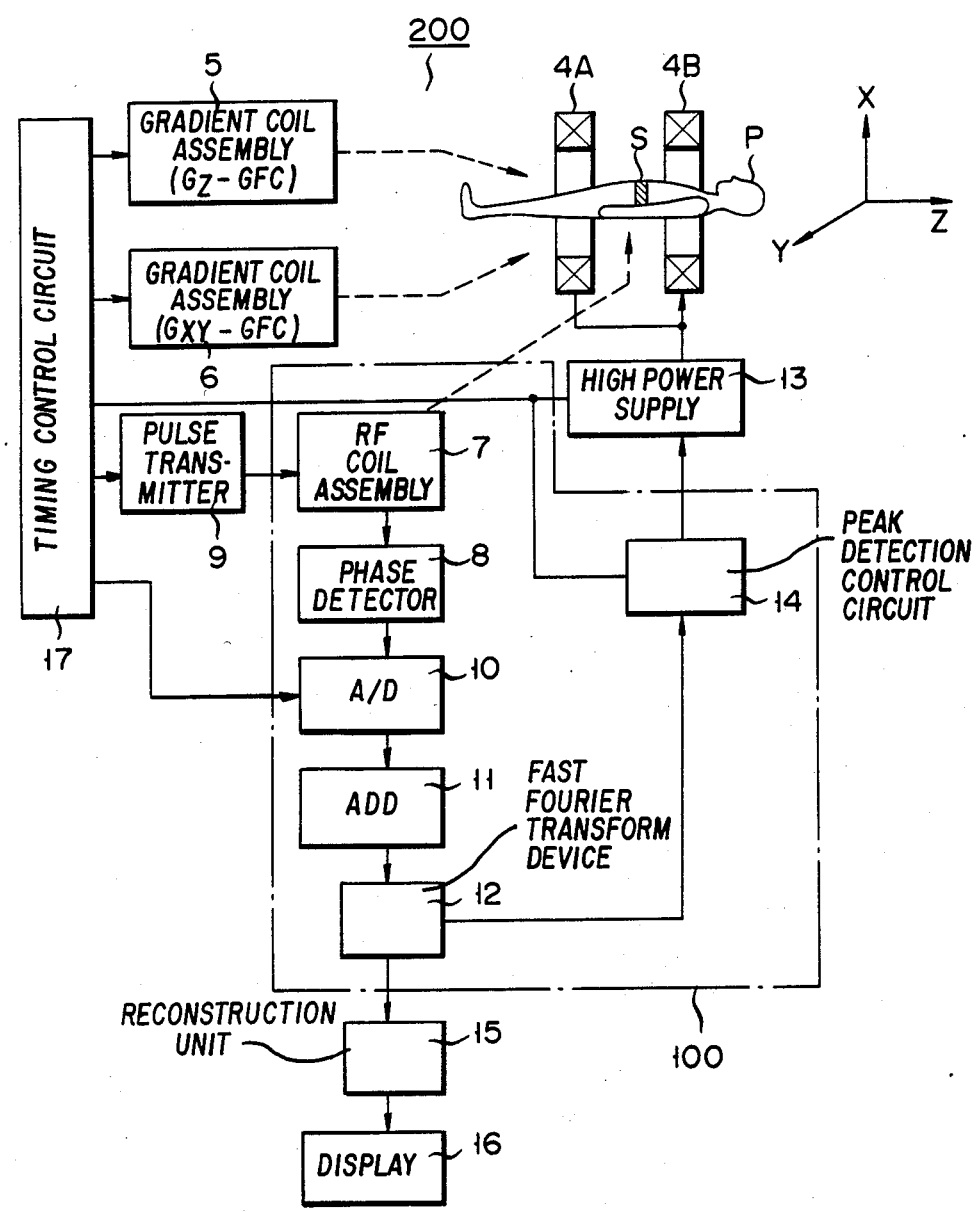

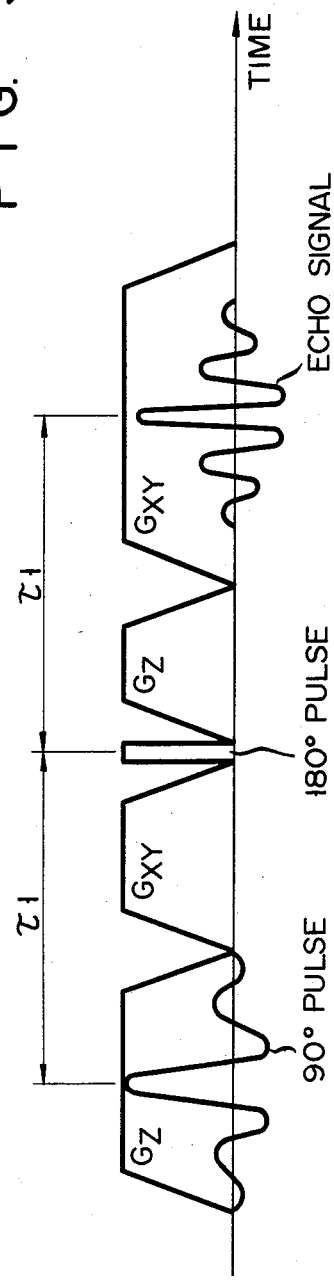
F I G. 5
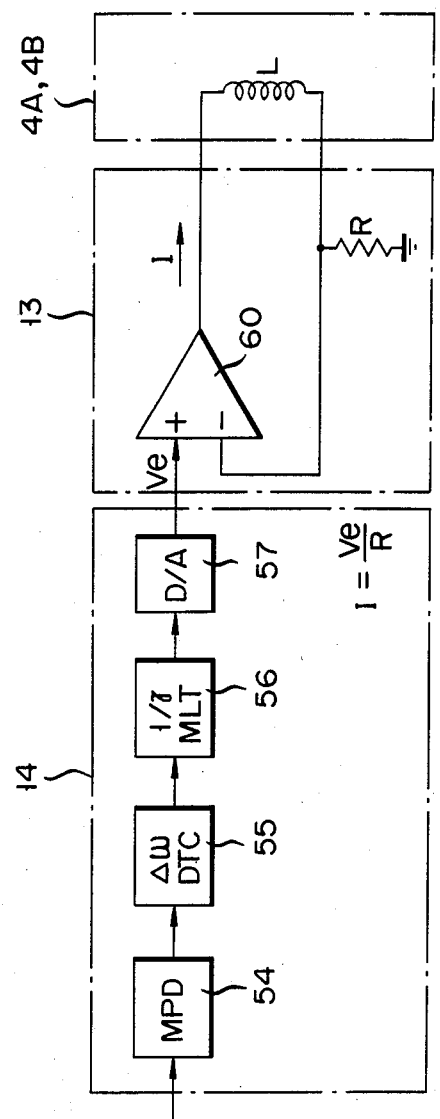
F I G. 6

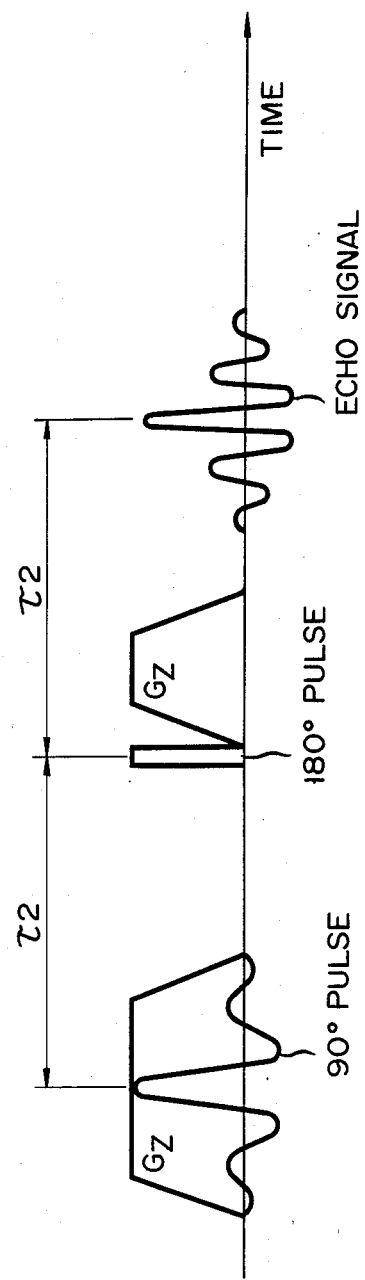
F I G. 7

CORRECTION CIRCUIT FOR A STATIC MAGNETIC FIELD OF AN NMR APPARATUS AND NMR APPARATUS FOR UTILIZING THE SAME

BACKGROUND OF THE INVENTION

1. Field of the Invention

The present invention relates to a correction circuit for a static magnetic field of a nuclear magnetic resonance (NMR) apparatus wherein a spin density and a relaxation time of specific nucleus are measured by utilizing the NMR phenomenon occurred in the object, e.g., a patient, and also an NMR apparatus into which the above-identified correction circuit is employed.

2. Description of the Prior Art

The first-mentioned NMR diagnostic apparatus is known from, for example, U.S. Pat. No. 4,254,778 issued on Mar. 10, 1981 to Clow.

The principle operation of the known NMR diagnostic apparatus will now be described with reference to FIG. 1. A tomographic image, or a proton density image of a patient may be obtained in the NMR diagnostic apparatus.

The tomographic image is, for example, defined as the same obtained by calculating data on, e.g., the spin density of the specific nucleus with respect to the given slice of the patient.

The tomographic image of the known NMR diagnostic apparatus may be obtained as follows.

As shown in FIG. 1, a uniform static magnetic field $H_0$ is applied to a patient P along the Z-axis (direction parallel to the longitudinal axis of the patient P). In addition, a linear gradient magnetic field $G_Z$ is generated by a pair of gradient field coils 1A and 1B and is superposed on the static magnetic field $H_0$ along the Z-axis. A specific nucleus in the static magnetic field $H_0$ resonates at an angular frequency $\omega_0$ given as follows:

$$\omega_0 = \gamma H_0 \tag{1}$$

where $\gamma$ is the proton gyromagnetic ratio which is inherent to the specific type of nucleus. A rotating magnetic field $H_1$ for resonating only the specific nucleus at the angular frequency $\omega_0$ is applied to the patient P through a pair of transmitter coils 2A and 2B. Upon application of these magnetic fields, an NMR phenomenon selectively occurs only at a slice (positioned on the X-Y plane perpendicular to the Z-axis) which is selected by the gradient field $G_Z$ along the Z-axis and which is represented by reference symbol "S". This NMR phenomenon is detected as an NMR signal, e.g., an FID signal or echo signal through a pair of receiver coils 3A and 3B. The resultant NMR signal is Fourier-transformed to obtain a single spectrum of a specific nucleus spin with respect to the rotating angular frequency. To obtain a tomographic image by a computerized tomographic method in accordance with the resultant information, projection images within the X-Y plane corresponding to the slice must be obtained from a multiple of directions. For this purpose, the slice is excited to generate the NMR phenomenon, and another linear gradient magnetic field $G_{XY}$ is superposed by coils (not shown) on the static field $H_0$ along the specific gradient direction in the X-Y plane. Equivalent field force lines at the slice of the patient P become parallel lines perpendicular to the gradient direction of the linear gradient field $G_{XY}$. The rotating angular frequency of the nucleus spin of the specific nucleus on each equivalent field force line is represented by equation (1) above. The NMR signal, e.g., an FID signal or echo signal detected under this condition is Fourier-transformed to obtain projection information (i.e., one-dimensional information of projection parallel to the equivalent field force lines) of the slice along the linear gradient field $G_{XY}$. In this manner, when the linear gradient field $G_{XY}$ is rotated within the X-Y plane (a rotation of the linear gradient field $G_{XY}$ is performed such that two pairs of gradient magnetic coils are used to generate the gradient field $G_{XY}$ as a composite magnetic field of the gradient field components $G_X$ and $G_Y$, and the composite ratio of the components $G_X$ and $G_Y$ is changed), the projection information toward the multiple directions within the X-Y plane can be obtained in the same manner as described above. Image reconstruction processing is then performed in accordance with the projection information, thereby obtaining a tomographic image.

Various patterns are provided for NMR excitation, NMR signal acquisition, and gradient field application sequence accompanied therewith. Only a typical example of these patterns has been exemplified in the above description.

In a diagnostic NMR apparatus of this type, drifts inevitably occur in a generation section (i.e., power supply) of the uniform static magnetic field $H_0$ and other components of the apparatus. Therefore, it is difficult to maintain predetermined resonant conditions for a long period of time. The conditions of the excited slice tends to be gradually deviated from the predetermined resonant conditions over time. When a deviation $\Delta\omega$ in the resonant frequency $\omega_0$ occurs on the order of several kilohertzs, resonance no longer occurs, and thus the NMR excitation cannot be realized. When the deviation falls within the range of several ten hertzs to several hundred hertzs, the excitation occurs to some extent. However, the image becomes unclear and the artifact appears. Therefore, in the diagnostic NMR apparatus, the deviation $\Delta\omega$ must be less than several hertzs.

There are generally two resonance adjustment methods as follows:

(I) Adjustment of the field strength of the static magnetic field $H_0$, (II) Adjustment of the RF exciting pulse frequency.

The following problems remain in the method (II).

(1) Since the exciting frequency range is wide, noise caused by disturbance tends to be mixed in, thereby degrading the S/N (signal-to-noise) ratio.

(2) Since the frequency bandwidth of the transmitter/receiver circuit system is varied, the circuit design becomes complicated.

Method (I), i.e., the adjustment of the field strength of the static magnetic field $H_0$ is considered desirable since it is free from the above-described problems (1) and (2). The resonant conditions will be stably maintained in accordance with method (I) in this specification.

In general, a conventional method for variably adjusting the field strength of the static magnetic field $H_0$ to correct for deviations in resonant conditions is employed in an NMR apparatus for material measurement.

For example, in addition to a probe head coil for detecting the target NMR signal, a relatively compact probe head coil is separately provided to detect a static field deviation $\Delta H_0$. There is provided for this puspose a method using a phantom which is independent of the main measuring phantom. Another method is also proposed wherein a magneto sensor, e.g., a magneto-resistive device is used in place of the deviation detecting probe head coil. In other words, in the conventional correcting means described above, the construction becomes complicated. In addition to this disadvantage, the apparatus becomes large as a whole.

Furthermore, the correction circuit system becomes complicated, and precise adjustment is required.

It is therefore an object of the present invention to provide a circuit for correcting the deviation of the static magnetic field without complex circuit arrangement.

Another object of the present invention is to provide an NMR diagnostic apparatus into which the above-described correction circuit is employed.

SUMMARY OF THE INVENTION

Those objects and the features of the present invention may be realized by providing a correction circuit for a static magnetic field of a nuclear magnetic resonance apparatus in that the static magnetic field is uniformly applied to a slice of an object under investigation, a gradient magnetic field is applied to the object in a direction prependicular to the slice of the object, and first and second exciting pulses are selectively applied to excite the slice of the object in conjunction with the static and gradient magnetic fields, whereby an echo signal is produced in the excited slice of the object, comprising:

means for detecting the echo signal;

A/D converting means for converting the detected echo signal into a corresponding digital echo siganl;

means for performing Fourier Transform to the digital echo signal so as to obtain a projection data signal;

means for detecting a maximum peak value from the projection data signal;

means for detecting a frequency shift relative to a nuclear magnetic resonant frequency based upon the detected maximum peak value; and means for multiplying the frequency shift by a given value so as to obtain deviation of the static magnetic field, whereby a field strength of the static magnetic field is varied based upon the deviation of the static magnetic field so as to be kept constant.

In accordance with the present invention, no specific constructive element, e.g., the probe head coil is additionally required. A precise correction on the deviation of the static magnetic field can be realized so that high spatial resolution can be obtained in the NMR imaging.

BRIEF DESCRIPTION OF THE DRAWINGS

The present invention is best understood by reference to the accompanying drawings, of which:

FIG. 4 is a schematic diagram of an NMR diagnostic apparatus into which the correction circuit according to the invention is employed;

FIGS. 5 and 7 are timing charts on the operations of the apparatus shown in FIG. 4;

FIG. 6 is a circuit diagram of a major circuit of the correction circuit according to one preferred embodiment.

DETAILED DESCRIPTION OF THE PREFERRED EMBODIMENTS

Before proceeding with the various types of the preferred embodiment, the principle of the correction circuit according to the present invention will now be described.

Only a gradient magnetic field perpendicular to the slice is used as the gradient magnetic field $G_Z$ superposed on a static magnetic field $H_0$. An echo signal is detected and Fourier-transformed. A peak value of the resultant projection signal is detected to detect a deviation $\Delta \omega$ from the nuclear magnetic resonant frequency. The deviation $\Delta \omega$ is multiplied by $1/\gamma$ to calculate a static field deviation $\Delta H_0$ in accordance with equation (2):

$$\Delta H_0 = \Delta \omega \gamma \qquad (2)$$

The calculated static field deviation $\Delta H_0$ is fed back to a static field power supply, thereby adjusting the field strength of the static magnetic field $H_0$ and correcting the resonant conditions. This control technique is so-called "magnetic field locked loop" (referred to as "MFLL" control hereinafter).

The basic circuit configuration (i.e., a correction circuit 100) will be described with reference to FIG. 2 to perform "MFLL" control associated with the present invention.

The general NMR apparatus is operated in the following manner to obtain a predetermined echo signal. In particular, a static field $H_0$ is applied to the patient in the normal manner. Only a gradient field perpendicular to the slice of the patient is applied to the patient for a predetermined time in a direction perpendicular to the slice. For example, when the longitudinal axis of the patient is aligned with the Z-axis of the X-Y-Z coordinate system, the gradient field along the direction (X-Y direction) perpendicular to the slice becomes $G_Z$. In other words, only the gradient field $G_Z$ is applied to the patient at predetermined moments for a predetermined time such that the gradient field $G_Z$ is superposed on the field $H_0$. In association with these application timings, 90° and 180° exciting pulses are selectively applied to the slice. For example, these exciting pulses are applied to the slice in conjunction with the fields $H_0$ and $G_Z$ in accordance with a 90° pulse-$\tau$-180° pulse ($\tau$: given time interval) sequence. In this manner, the echo signal can be obtained from the slice. Those waveforms and timings are essentially shown in FIGS. 5 and 7. It should be noted that the second gradient magnetic field $G_{XY}$ is not used to correct the static magnetic field $H_0$ in the "MFLL" control.

Figure 1:
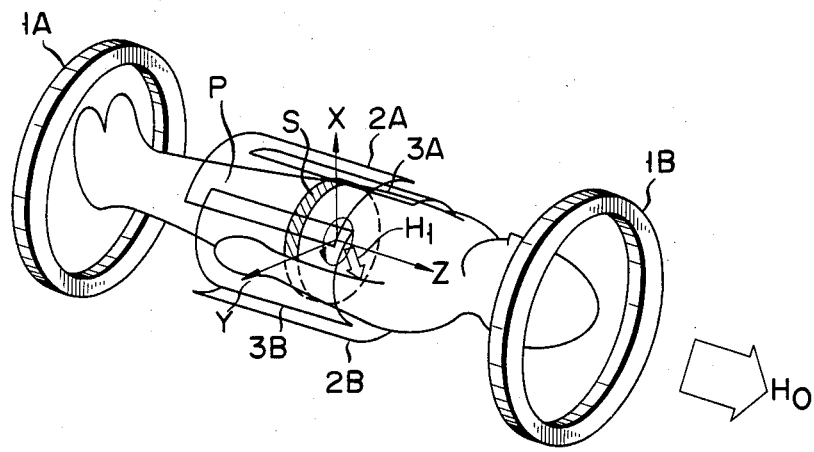
FIG. 1 is a schematic illustration how to acquire NMR signals in accordance with the principle of the NMR diagnostic apparatus.
Figure 3:
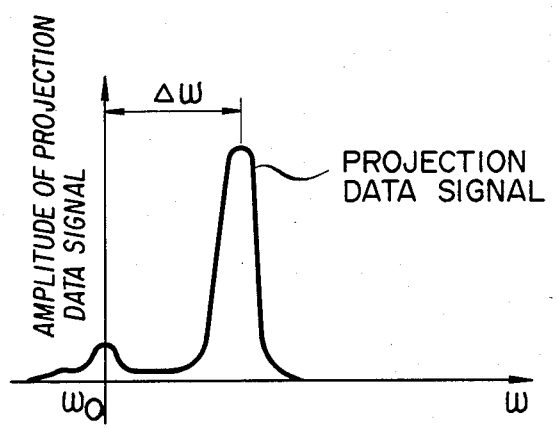
FIG. 3 is an illustration of the projection data signal and the frequency shift $\Delta \omega$.

This echo signal is detected by a signal detector 51 to obtain phase components of the echo signal. These phase components are converted by an A/D converter 52 to obtain a digital echo signal. The digital echo signal is then Fourier-transformed by a Fourier transform device 53, thereby obtaining projection data signal (see FIG. 3) of the detected echo signal. A maximum peak value of the projection data signal is detected by a max. peak detector 54. This peak value is supplied to a $\Delta \omega$ detector 55 which then detects a frequency shift $\Delta\omega$ with respect to the nuclear magnetic resonant frequency $\omega_0$. As is apparent from FIG. 3, this projection data signal has a small DC-component peak near the 0 point of the coordinate system and a magnitude along the axis plotting the frequency $\omega$ is small because the gradient field along the slice direction is not applied. When the frequency shift $\Delta\omega$ is multiplied by $1/\gamma$ to obtain the deviation on static field "$\Delta H_0$" by means of a multiplier 56 in accordance with equation (2). Thus obtained deviation on static field "$\Delta H_0$" is converted by a D/A converter 57 to an analogue value. A DC excitation current from the power supply for static field to the static field coil assembly is adjusted such that the deviation "$\Delta H_0$" becomes zero. In other words, a control loop is formed between the correction circuit 10 and the associated circuit elements such as the $H_0$ power supply so as to correct the field $H_0$.

Figure 2:
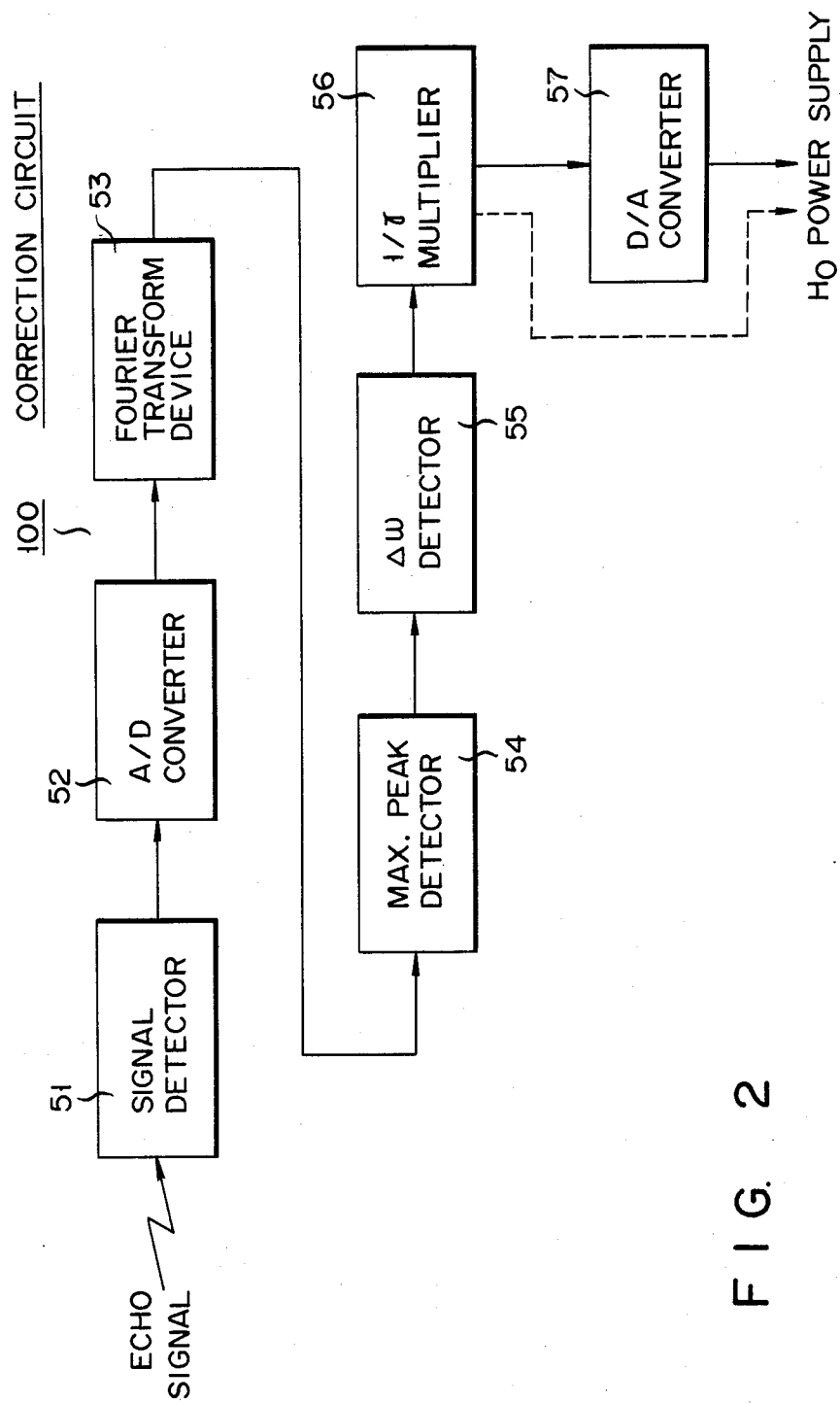
FIG. 2 is a circuit diagram of a basic circuit of a correction circuit according to the invention.

It should be noted that the D/A converter 57 may be omitted from the correction circuit shown in FIG. 2 if the $H_0$ power supply is controllable in a digital control signal.

FIG. 4 shows an NMR diagnostic apparatus 200 using the correction circuit 100 according to an embodiment of the present invention. The configuration of the apparatus 200 shown in FIG. 4 is as follows. Reference numerals 4a and 4b denote air coil assemblies for applying the uniform static magnetic field $H_0$ to the patient P; 5, a first gradient field coil assembly for generating first gradient magnetic fields $G_Z$ and/or $G_Z$ along the direction (Z-axis since the slice is defined as the X-Y plane) perpendicular to the slice S; 6, a second gradient field coil assembly for generating second gradient magnetic fields $G_{XY}$ and/or $-G_{XY}$ along the slice (the respective directions in the X-Y plane); 7, an RF coil assembly for transmitter/receiver; 8, a phase detector of a quadrature phase detection method for detecting the in-phase component (real part) and 90° phase component (imaginary part) of the echo signal with respect to the reference signal; 9, a transmitter for generating 90° and 180° exciting pulses consisting of RF pulses of an angular frequency $\omega$ and transmitting them through the RF coil assembly 7; 10, an A/D (analogue-to-digital) converter for converting to a digital signal the echo signal which is detected by the phase detector 8; 11, an adder for adding echo signal data generated from the A/D converter 10 by a predetermined number of times so as to obtain a means value of the sum; and 12, a high-speed Fourier transform device for Fourier-transforming the resultant echo signal data from the adder 11. Reference numeral 13 denotes a power supply for static magnetic field in order to excite the air coil assemblies 4A and 4B so as to generate the static magnetic field $H_0$; and 14, a static field control circuit for controlling the power supply 13 in accordance with the data generated from the high-speed Fourier transform device 12 when the MFLL control is performed. Reference numeral 15 denotes an image reconstruction devide for performing image reconstruction processing in accordance with an output of the high-speed Fourier transform device 12 when the MFLL control is not performed; 16, a display device for displaying an image obtained by the image reconstruction device; and 17, a timing control system for controlling operation timings of the components described above. It should be noted that the correction circuit 100 comprises a part surrounded by a dotted line, and that the field $H_0$ is continuously applied to the slice until the echo signal acquisition is performed.

The operation of the apparatus having the configuration described above will now be described.

Normal NMR imaging will be described with reference to the timing chart in FIG. 5.

In this case, the air coil assemblies 4A and 4B are energized by the $H_0$ power supply 13 to apply the uniform static magnetic field $H_0$ to the patient P. The first gradient magnetic field $+G_Z$ having the gradient with respect to the direction (Z direction) perpendicular to the slice (located within the X-Y plane) is superposed by the first gradient field coil assembly 5 on the uniform static magnetic field $H_0$. At the same time, the 90° exciting pulse is applied from the transmitter 9 to the patient P in the field through the RF coil assembly 7. After the first gradient magnetic field $+G_Z$ and the 90° exciting pulse are applied, the second gradient magnetic field $+G_{XY}$ is superposed by the gradient field coil assembly 6 on the static magnetic field $H_0$ along the direction (X-Y plane) parallel to the slice S. After the application of the second gradient magnetic field $G_{XY}$, the 180° exciting pulse is applied from the transmitter 9 to the patient P through the RF coil assembly 7. The 180° exciting pulse is applied to the patient when a time periods $\tau 1$ has elapsed after the application of the 90° exciting pulse. In addition, the first gradient magnetic field $+G_Z$ is superposed by the gradient field coil assembly 5 to the static magnetic field $H_0$ for a predetermined time period. After the application of the first gradient magnetic field $G_Z$, while the second gradient magnetic field $G_{XY}$ is superposed by the second gradient field coil assembly 6 on the static magnetic field $H_0$ for a predetermined time period, the echo signal is received from the patient P through the RF coil assembly 7 when the time period $\tau 1$ has elapsed after the application of the 180° exciting pulse. The echo signal received by the RF coil assembly 7 is phase-detected by the phase detector 8. The detected signal is converted by the A/D converter 10 to a digital signal. The digital signal is supplied to the adder 11. The above operation is repeated to obtain a sum of the echo signal data, and a mean value is obtained from the sum. It should be noted that the mean value of the sum is obtained to improve the S/N ratio. The mean echo signal data is Fourier-transformed by the high-speed Fourier transform device 12, thereby obtaining the projection data signal shown in FIG. 3. Other projection data signals are then obtained by changing the gradient directions of the second gradient magnetic field $G_{XY}$, and image reconstruction is performed by the image reconstruction device 15. The resultant tomographic image is then displayed on a display device 16.

The MFLL control employed in the apparatus shown in FIG. 4 will be described with reference to FIG. 6.

As previously mentioned in association with FIG. 2, when MFLL control is performed, a pulse sequence is adopted which excludes the application of the second gradient magnetic field $G_{XY}$ by means of the second gradient field coil assembly 6 from the pulse sequence employed in normal NMR imaging, thereby obtaining the echo signal.

In particular, in the apparatus 200 shown in FIG. 4, the uniform static magnetic field $H_0$ is applied to the patient P by means of the air coil assemblies 4A and 4B. As is shown in the pulse sequence in FIG. 7, the first gradient magnetic field $G_Z$ is superposed by the first gradient coil assembly 5 on the uniform static magnetic field $H_0$ along the direction perpendicular to the desired slice for a predetermined time period. At the same time, the 90° exciting pulse is applied by the RF coil assembly 7 to the patient P within the fields $H_0$ and $G_Z$. Subsequently, the 180° exciting pulse is applied by the RF coil assembly 7 to the patient P without applying the second gradient magnetic field $G_{XY}$ thereto. In addition, the first gradient magnetic field $G_Z$ is superposed by the first gradient field coil assembly 5 again on the static magnetic field $H_0$ for a predetermined time period. The echo signal is received by the RF coil assembly 7 from the patient P when a predetermined time interval has elapsed. In the same manner as normal NMR imaging, the receiving echo signal is phase-detected by the phase detector 8, and the detected signal is then converted by the A/D converter 10 to a digital signal. The digital signal is then supplied to the adder 11. The above operation is repeated, and the mean data signal is then obtained from the sum. The mean echo data signal is Fourier-transformed by the high-speed Fourier transform device 12, thereby obtaining the projection data signal shown in FIG. 3. This projection data signal is supplied to the control circuit 14 (see FIG. 6) for static field which is not used in normal NMR imaging.

The control circuit 14 detects the maximum peak value of the projection data signal. A deviation $\Delta\omega$ in angular frequency (see FIG. 3) is calculated in accordance with the detected peak value. The static field deviation $\Delta H_0$ is calculated in accordance with equation (2), thereby controlling the $H_0$ power supply 13. Referring to FIG. 6, there is provided a max. peak detector 54 for detecting the maximum peak value of the projection data signal generated by the FFT 12. There is also provided the $\Delta\omega$ detector ($\Delta\omega$ DTC) 55 for detecting the frequency deviation $\Delta\omega$ from the nuclear magnetic resonant frequency $\omega$ plotted along the abscissa. A multiplier ($1/\gamma$ MLT) 56 is provided to multiply the deviation $\Delta\omega$ obtained from the $\Delta\omega$ detector 55 by $1/\gamma$ in accordance with equation (2) so as to calculate a static field deviation $\Delta H$. A D/A (digital-to-analogue) converter 57 is provided to convert to an analogue signal the static field deviation $\Delta H$ as the correction value calculated by the multiplier 56. The analogue signal from the D/A converter 57 is supplied to an operational amplifier 60 of the $H_0$ power supply 13, so that the static magnetic field $H_0$ is corrected to eliminate the frequency deviation $\Delta\omega$. In other words, a static field current I derived from an output voltage Ve from the D/A converter 57 and a shunt resistor R is supplied to the first gradient coil assemblies 4A and 4B so as to perform correction.

When the static magnetic field $H^0$ and so on are deviated due to a drift to the like and the anglar frequency deviation $\Delta\omega$ occurs, the MFLL control is performed to optimally correct the static magnetic field $H_0$ within a short period of time. In addition, special external devices, e.g., probe head coil need not be added for correction.

Figure 8:
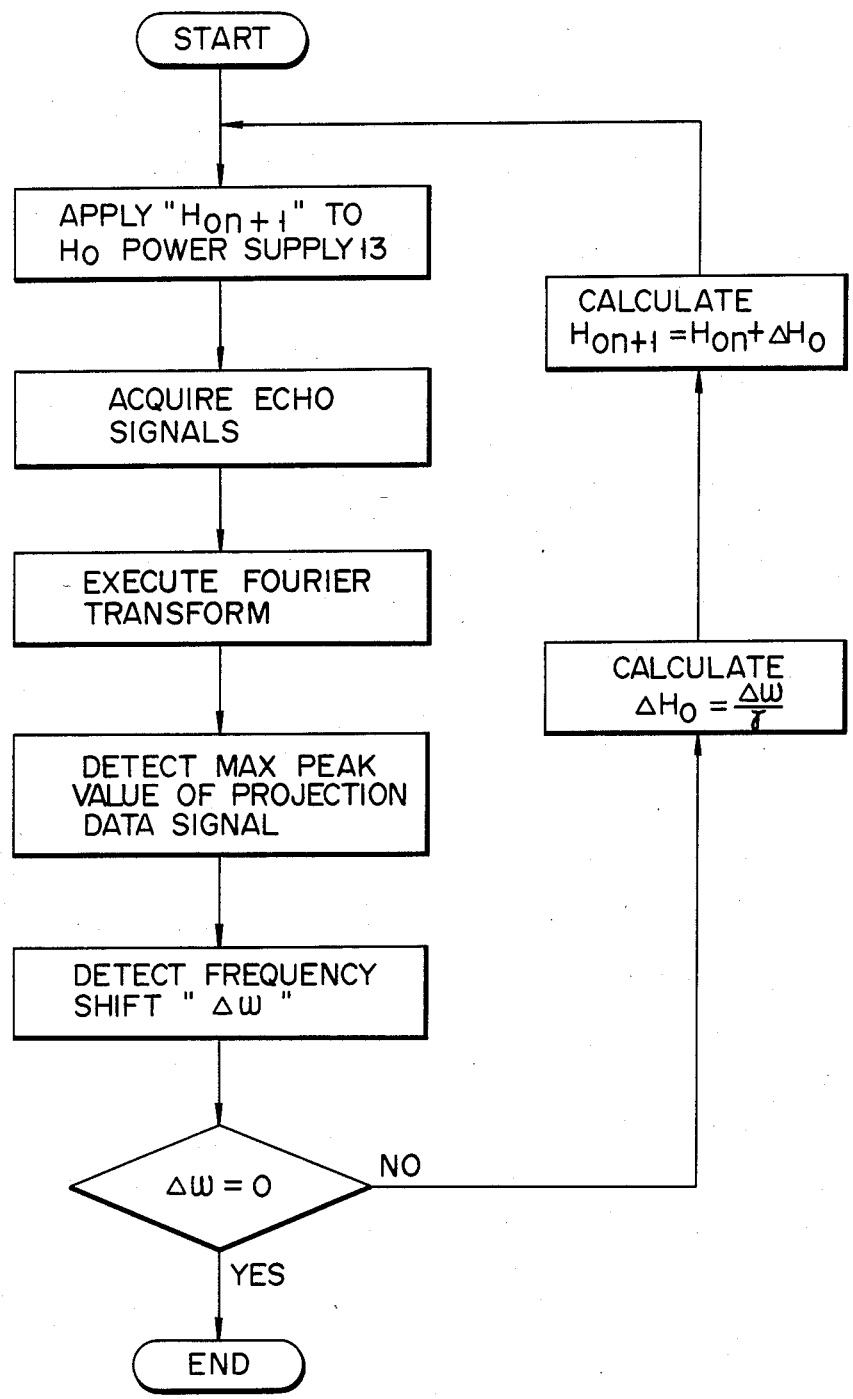
FIG. 8 shows a flow chart on the control operation of the magnetic field locked loop utilized in the correction circuit shown in FIG. 6.

FIG. 8 is a flow chart for showing the sequence of the MFLL control described above. The MFLL control operation will be described with reference to the flow chart.

The echo signal is obtained under the prescribed conditions and is processed by the circuits shown in FIGS. 4 to 6, thereby obtaining the projection data signal. In addition, the static field shift $\Delta\omega$ is calculated. The desired static magnetic field correction value $\Delta H_0$ is derived from the static field shift $\Delta\omega$. The resultant value $\Delta H_0$ is added to a previous correction value $H_{0n}$, so that an updated correction value $H_{0n+1}$ is obtained.

This correction value $H_{0n+1}$ is supplied to the $H_0$ power supply 13. The exciting current I for static magnetic field generation is changed as described in association with FIG. 6, thereby changing the field strength of the static field $H_0$.

After this correction, the echo signal is received again to perform signal processing in the same manner as described above, and the shift $\Delta\omega$ is obtained again. If the shift $\Delta\omega$ is not zero, MFLL control is started to change the field strength of the static field $H_0$.

The above operation is repeated such that the shift $\Delta\omega=0$ is established. This control operation is performed at a high speed, so that the correction of Hcan be quickly completed, and optimal resonant conditions can be maintained.

While the invention has been described in terms of certain preferred embodiments, and exemplified with respect thereto, those skilled in the art will readily appreciate that various modifications, changes, omissions and substitutions may be made without departing from the spirit of the invention.

In the above embodiment, the pulse sequence of 90° pulse-180° pulse is used. However, a pulse sequence of 180° pulse-90° pulse-180° pulse can be used in place of the 90° pulse-180° pulse sequence to obtain the prescribed echo signals. It is essential that the 180° pulse is finally applied to the patient to obtain the echo signal. The positive and negative components ($+G_Z$ and $-G_Z$) of the first field gradient field $G_Z$ may be sequentially applied to the slice of the patient P.

Furthermore, some or all of the adder 11, the high-speed Fourier transform device 12, the static field control circuit 14 and the timing control system 17 shown in FIG. 4 may be replaced with a microcomputer, and the functions of the components shown in FIG. 4 can be performed by software. In this case, the microcomputer constituting the image reconstruction device 15 can be commonly used as the microcomputer described above. In this manner, the new configuration is the same as that in normal NMR imaging from the software point of view.

In the above embodiments, the longitudinal axis of the object is defined to be parallel to the Z-axis of the X-Y-Z coordinate system. The magnetic field $G_Z$ is used as the first gradient magnetic field to obtain the echo signal for the MFLL control. In other words, only the first gradient magnetic field needs to produce the echo signal for the MFLL control. However, the present invention is not limited to this arrangement. For example, when the longitudinal axis is defined to be parallel to another axis of the X-Y-Z coordinate system, the first gradient field apparently corresponds to $G_X$ or $G_Y$.

What is claimed is:

1. A correction circuit for a nuclear magnetic resonance apparatus in which a static magnetic field having an anticipated magnetic field $H_0$ is uniformly applied to a slice of an object under investigation, a first gradient magnetic field is applied to the object in a direction perpendicular to the slice of the object, a second gradient magnetic field is applied to the object in a direction parallel to the slice of the object, and first and second exciting pulses are selectively applied to excite the slice of the object in conjunction with the static and first and second gradient magnetic fields to excite nucleus in said slice having a proton gyromagnetic ratio $\gamma$, whereby an echo signal is produced in the excited slice of the object, comprising:

means for activating only said static magnetic field and first gradient magnetic field, without activation of said second gradient magnetic field;

means for detecting the resultant echo signal upon application of said first and second exciting pulses;

A/D converting means for converting the resultant echo signal into a correspondng digital echo signal;

means for performing a Fourier Transform on the digital echo signal to obtain a resultant projection data signal;

means for detecting the frequency of the maximum peak value of the projection data signal;

means for detecting the frequency difference $\Delta\omega$ between the frequency of said maximum peak value of said projection data signal and the expected angular frequence $\omega_o$ of said nucleus having said proton gyromagnetic ratio $\gamma$;

means for multiplying the frequency difference $\Delta\omega$ by a given value so as to obtain a signal representing the deviation of the static magnetic field from said anticipated magnetic field $H_0$;

means for maintaining said static magnetic field constant in response to said deviation signal; and means for subsequently activating the resultant static magnetic field and the first and second gradient magnetic fields and for thereafter obtaining a subsequent projection data signal from which an image of said slice of said object may be obtained.

2. A correction circuit as claimed in claim 1, wherein the first and second exciting pulses are 90° and 180° exciting pulses respectively.

3. A correction circuit as claimed in claim 1, wherein the means for detecting the resultant echo signal is a quadrature phase detector by which phase components of the echo signal is derived.

4. A correction circuit as claimed in claim 1, wherein the means for performing Fourier Transform is a high speed Fourier Transform device.

5. A correction circuit as claimed in claim 1, wherein said means for maintaining said static magnetic field constant includes D/A converting means for converting said deviation signal from digital into corresponding analog form.

6. A correction circuit as claimed in claim 5, wherein the first and second exciting pulses are 90° and 180° exciting pulses respectively.

7. A correction circuit as claimed in claim 5, wherein the means for detecting the echo signal is a quadrature phase detector by which phase components of the echo signal is derived.

8. A correction circuit as claimed in claim 5, wherein the means for performing Fourier Transform is a high speed Fourier Transform device.

9. A method for examining an object by nuclear magnetic resonance comprising the steps of:
applying a uniform static magnetic field to the object having an anticipated magnetic field $H_0$;
applying to the object a first gradient magnetic field in a direction perpendicular to a slide of the object in the absence of any second gradient magnetic field in a direction parallel to said slide;
generating first and second exciting pulses to excite nucleus in said slice having a proton gyromagnetic ratio $\gamma$;
detecting a resultant echo signal from the slice of the object;
converting the detected echo signal into a corresponding digital echo signal;
performing a Fourier Transform on the digital echo signal to obtain a resultant projection data signal;
maintaining said static magnetic field constant in response to said projection data signal;
applying the resultant static magnetic field, said first gradient magnetic field and said second gradient magnetic file to said object;
regenerating said first and second pulses;
detecting a new resultant echo signal from the slice of the object;
converting the new detected echo signal into a corresponding new digital echo signal;
performing a Fourier Transform on the new digital echo signal so as to obtain a new resultant projection data signal;
performing image reconstruction processing to the new projection data signal; and
displaying a tomographic image of the slice of the object that is obtained from the image reconstruction processing.

10. A method as claimed in claim 9, wherein the step of maintaining said static magnetic field constant includes the substeps of:
detecting the frequency of a maximum peak value of the projection data signal;
detecting the frequency difference $\Delta\omega$ between the frequency of said maximum peak value of said projection data signal and the expected angular frequency $\omega_o$ of said nucleus having said proton gyromagnetic ratio $\gamma$;
multiplying the frequency difference $\Delta\omega$ by a given value so as to obtain a signal representing the deviation of the static magnetic field from said anticipated magnetic field $H_0$;
converting the deviation signal from digital into corresponding analog form; and
controlling the field strength of the static magnetic field as a function of said analog form of the deviation signal by applying said analog form of the deviation signal to one input of an operational amplifier whose output controls the magnitude of said static magnetic field.

11. A method as claimed in claim 9, wherein the first and second exciting pulses are 90° and 180° exciting pulses respectively.

12. A method as claimed in claim 9, wherein the step of detecting the echo signal includes use of a quadrature phase detector from which phase components of the echo signal are derived.

13. A method as claimed in claim 9, wherein the steps of performing Fourier Transform are performed in a high speed Fourier Transform device.

* * * * *